(12) United States Patent
Yalamanchili

(10) Patent No.: US 11,821,073 B2
(45) Date of Patent: Nov. 21, 2023

(54) VANADIUM ALUMINIUM NITRIDE (VALN) MICRO ALLOYED WITH TI AND/OR SI

(71) Applicant: Oerlikon Surface Solutions AG, Pfäffikon, Pfäffikon (CH)

(72) Inventor: Siva Phani Kumar Yalamanchili, Sargans (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 17/288,277

(22) PCT Filed: Oct. 28, 2019

(86) PCT No.: PCT/EP2019/079411
§ 371 (c)(1),
(2) Date: Apr. 23, 2021

(87) PCT Pub. No.: WO2020/084167
PCT Pub. Date: Apr. 30, 2020

(65) Prior Publication Data
US 2021/0388482 A1    Dec. 16, 2021

Related U.S. Application Data

(60) Provisional application No. 62/751,022, filed on Oct. 26, 2018.

(51) Int. Cl.
C23C 14/06  (2006.01)
C23C 14/34  (2006.01)
C23C 28/04  (2006.01)

(52) U.S. Cl.
CPC ........ *C23C 14/0641* (2013.01); *C23C 14/345* (2013.01); *C23C 14/3414* (2013.01);
(Continued)

(58) Field of Classification Search
CPC ... B23B 27/14; B23B 27/148; C23C 14/0641; C23C 14/345; C23C 14/3464; C23C 28/042
(Continued)

(56) References Cited

U.S. PATENT DOCUMENTS 4,842,710 A * 6/1989 Freller ................ C23C 14/0641
204/192.16
5,700,551 A * 12/1997 Kukino ................. C23C 30/005
51/309

(Continued)

FOREIGN PATENT DOCUMENTS

CN    105122385 A   12/2015
DE    112016004255 T5   6/2018
(Continued)

OTHER PUBLICATIONS

International Preliminary Report on Patentability for PCT Application No. PCT/EP2019/079411 dated Apr. 27, 2021, 7 pages.
(Continued)

*Primary Examiner* — Daniel J. Schleis
(74) *Attorney, Agent, or Firm* — Michael J. Blessent; Bret E. Field; Bozicevic, Field & Francis LLP

(57) ABSTRACT

The present invention discloses a high-temperature stable ceramic coating structure including a microalloy comprising the elements Al, V and N producible by a gas phase deposition process.

15 Claims, 3 Drawing Sheets

Figure 1:
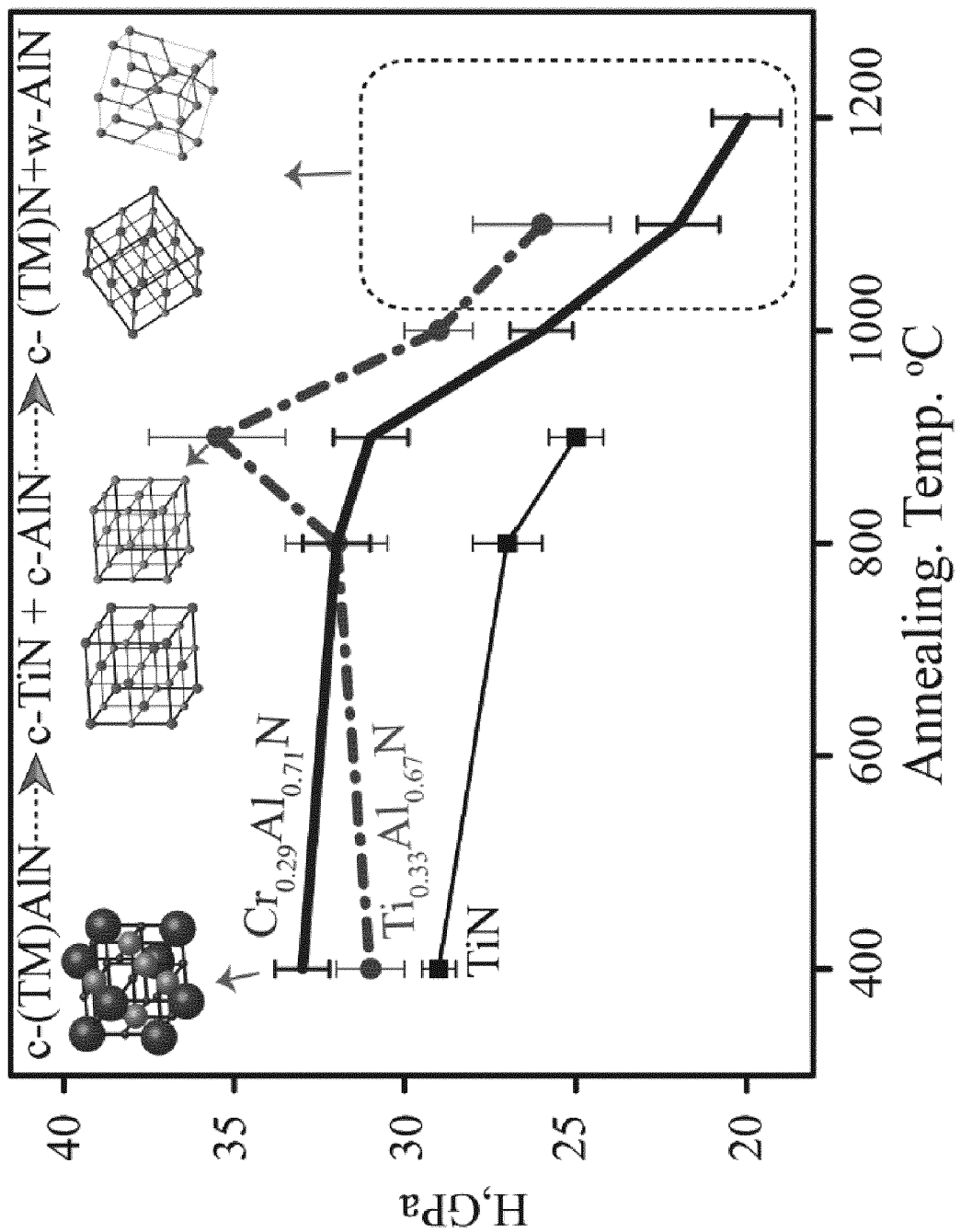

(52) U.S. Cl.
CPC ........ *C23C 14/3464* (2013.01); *C23C 28/042* (2013.01); *C23C 28/044* (2013.01)

(58) Field of Classification Search
USPC ........................................ 428/697, 698, 699
See application file for complete search history.

(56) References Cited

U.S. PATENT DOCUMENTS

| | | | | |
|---|---|---|---|---|
| 5,981,049 | A * | 11/1999 | Ohara | C23C 14/0641 204/192.15 |
| 6,296,928 | B1 * | 10/2001 | Yamada | C23C 14/0664 428/697 |
| 6,767,658 | B2 | 7/2004 | Yamamoto et al. | |
| 9,416,440 | B2 | 8/2016 | Hultman et al. | |
| 2004/0110039 | A1 | 6/2004 | Horling et al. | |
| 2006/0177698 | A1 | 8/2006 | Yamamoto | |
| 2010/0038232 | A1 * | 2/2010 | Yamamoto | C23C 14/3414 428/697 |
| 2012/0148762 | A1 * | 6/2012 | Wei | C23C 14/35 204/192.15 |
| 2014/0193623 | A1 | 7/2014 | Setoyama et al. | |
| 2016/0118165 | A1 * | 4/2016 | Fujita | H01C 7/008 204/192.21 |
| 2018/0195162 | A1 * | 7/2018 | Kitagishi | B21D 37/20 |
| 2018/0245201 | A1 * | 8/2018 | Park | C23C 14/548 |

FOREIGN PATENT DOCUMENTS

| | | | |
|---|---|---|---|
| EP | 2 100 985 | * | 9/2009 |
| JP | 2003-34859 | A | 2/2003 |
| JP | 2009-197268 | A | 9/2009 |
| JP | 2009197268 | * | 9/2009 |
| JP | 2012-166320 | A | 9/2012 |

OTHER PUBLICATIONS

Yalamanchili et al., Exploring the high entropy alloy concept in (AlTiVNbCr)N, Thin Solid Films, Aug. 2017, vol. 636, p. 346-352.
Tsai et al., Thermally stable amorphous (AlMoNbSiTaTiVZr)50N50 nitride film as diffusion barrier in copper metallization, Applied Physics Letters, Mar. 2008, vol. 92, No. 5, p. 052109-1-052109-3.
Office Action for China Application No. 201980069882.8 dated Nov. 23, 2022, with its English summary, 10 pages.
Second Office Action for China Application No. 201980069882.8 dated Apr. 22, 2023, with its English summary, 20 pages.
Office Action for Japanese Application No. 2021-522464 dated Jul. 18, 2023, with its English translation, 18 pages.
Office Action for European Application No. 19795199.9 dated Jul. 11, 2023, 5 pages.
Office Action for Chinese Application No. 201980069882.8 dated Aug. 15, 2023, with its English translation, 16 pages.

* cited by examiner

VANADIUM ALUMINIUM NITRIDE (VALN) MICRO ALLOYED WITH TI AND/OR SI

The present invention is about wear resistant coating alloys at least comprising transition-metal—Al—N coated by PVD and/or related processes, intended for high temperature application above 800° C.

STATE OF THE ART

PVD coatings consisting of metastable c-TM-Al—N are well known for their wear resistant applications (Note: "c-" means cubic, "TM" means transition metal, "Al" means Aluminum and "N" means nitrogen).

These coatings show an optimal combination of hardness, fracture resistance, and oxidation resistance. As a result, even applying only a few micron thin coating causes significant enhancement in life time of tools, and components in cutting, forming, and other related applications in automotive, and aerospace.

However, these known coatings consisting of metastable phases display limited thermal stability measured by hardness as a function of annealing temperature (as will be shown in FIG. 1 later) showing the likely max. application temperature for these coatings.

Several investigations on this topic has revealed that the metastable alloys of c-M-Al—N might display a Hardness enhancement at intermediate annealing temperatures between 800° C. and 900° C.

The key challenge is at annealing temperatures above 900° C., where the metastable alloy decomposes to their respective ground states by the following reaction resulting hardness loss as also shown in FIG. 1.

This decomposition can be illustrated in the following way:

Metastable c-TM-Al—N--->c-TMN+w-AlN  (1)

where TM could for example be Ti, Cr, Nb, V.

The resultant w-AlN has a lower elastic modulus of 300 GPa, and lower hardness of 25 GPa.

The above-mentioned lower hardness caused by phase transformation limits the application temperature of these coatings to a maximum temperature of 800° C. for longer exposure times up to 100 hours, and 900° C. for short exposure times up to 1 hour.

For the applications involving higher annealing temperatures and longtime exposure above 900° C. and more than 100 hours—such applications could for example be hot metal working or turbine tipping sealant applications—superior alloys needed where a stable hardness is maintained above the annealing temperature of 900° C.

OBJECTIVE OF THE PRESENT INVENTION

It is an object of the present invention to alleviate or to overcome one or more difficulties related to the prior art. In particular, it is an object of the present invention to provide a hard, fracture resistant and oxidation resistant coating structure that is stable at high temperatures and manufacturable in an easy and cost-efficient manner.

DESCRIPTION OF THE PRESENT INVENTION

We were exploring different alloy combinations and surprisingly found that the AlVN alloy micro alloyed with Ti and Si shows a hardness anomaly making them more appealing for high temperature application:

Thus, in a first aspect of the present invention a high-temperature stable ceramic coating structure including a microalloy comprising the elements Al, V and N is disclosed, which is producible by a gas phase deposition process.

The term high-temperature stable coating structure in the context of the invention is understood in particular as a structure which is stable over a long period of time up to a temperature of at least 800° C., i.e. which can be used at a temperature above 800° C. for up to 100 h without showing any significant loss of hardness.

In another example of the first aspect, the coating structure is formed in the form of a metastable coating structure, which is in multiphase form at least above a temperature of 900° C., in particular in cubic phase and wurtzite phase form.

In another example of the first aspect, the coating structure having a hardness increase and/or an increased fracture toughness above 900° C., the hardness increase and/or the fracture toughness preferably being associated with the phase transformation of the coating structure, in particular being based on the phase transformation of the coating structure.

In another example of the first aspect, the coating structure is stable above a temperature of 900° C. for longer exposure times of more than 50 hours, preferably of more than 75 hours, in particular of more than 100 hours. Stable in this context particularly means not phase-stable, but material-stable.

In another example of the first aspect, the coating structure has a layer thickness of less than 10 μm, preferably of less than 1 μm, in particular of less than 500 nm.

In another example of the first aspect, the coating structure being in the form of a thin film or in bulk form.

In another example of the first aspect, the coating structure is formed as a multilayer structure.

In another example of the first aspect, the microalloy comprises solely Al and V in addition to N, preferably in a ratio of Al to V of $Al_{65}V_{35}$.

In another example of the first aspect, the microalloy comprises further elements in addition to Al, V and N, preferably Ti and/or Si, in particular in an amount of in each case less than 5 at.-%. In addition to these possible further elements, the coating structure according to the invention may also include other elements, preferably transition metals, in particular Zr and/or Nb and/or Ta.

In another example of the first aspect, said microalloy comprises Al, V and N, Ti and Si, wherein said microalloy preferably being formed in the form of $Al_{64}V_{33}Ti_2Si_1N$.

In another example of the first aspect, the coating structure also comprises oxides and/or carbides in addition to nitrides. According to the first aspect of the invention, the coating structure may also include silicides and/or borides.

In a second aspect, a gas phase deposition process for producing a high temperature stable ceramic coating structure mentioned before, is disclosed, comprising the steps:

Evaporation of a target material comprising the elements Al and V,

Deposition of the evaporated target material on a suitable substrate to form the high temperature stable ceramic coating structure.

According to the second aspect of the invention, the substrate can be formed at least partially in the form of a metal compound.

In another example of the second aspect, different target materials are used, wherein the different target materials are preferably vaporized simultaneously.

In another example of the second aspect, one of the target materials comprises Al and V, preferably in a ratio of $Al_{65}V_{35}$.

In another example of the second aspect, one of the target materials comprises Ti and Si, preferably in a ratio of $Ti_{75}Si_{25}$.

In another example of the second aspect, a Co-containing substrate is used, wherein said substrate being formed in particular in the form of WC-Co.

In another example of the second aspect, the substrate temperature being between 200° C. and 500° C., preferably between 300° C. and 450° C., in particular 400° C.

In another example of the second aspect, a reactive coating gas is used, wherein preferably nitrogen is used as reactive coating gas. According to the second aspect of the invention also other gases, such as argon or methane can be used as reactive coating gases in addition to nitrogen.

In another example of the second aspect, a negative bias voltage is applied to the substrate during the coating process, wherein the bias voltage is less than 120 V, preferably less than 90 V, more preferably less than 75 V.

In another example of the second aspect, the coating process is formed in the form of a PVD coating process, preferably in the form of a sputtering process, in particular in the form of a HiPIMS or ARC PVD process.

In another example of the second aspect, a plurality of layers of the coating structure mentioned before are deposited on top of each other to form a multilayer layer structure.

In a third aspect a use of the coating structure mentioned before for the production of cutting and forming tools is disclosed, in particular for use in the automotive and/or aerospace industries.

The invention will now be described in detail on the basis of examples and with the help of the figures.

DETAILED DESCRIPTION

Figure 2:
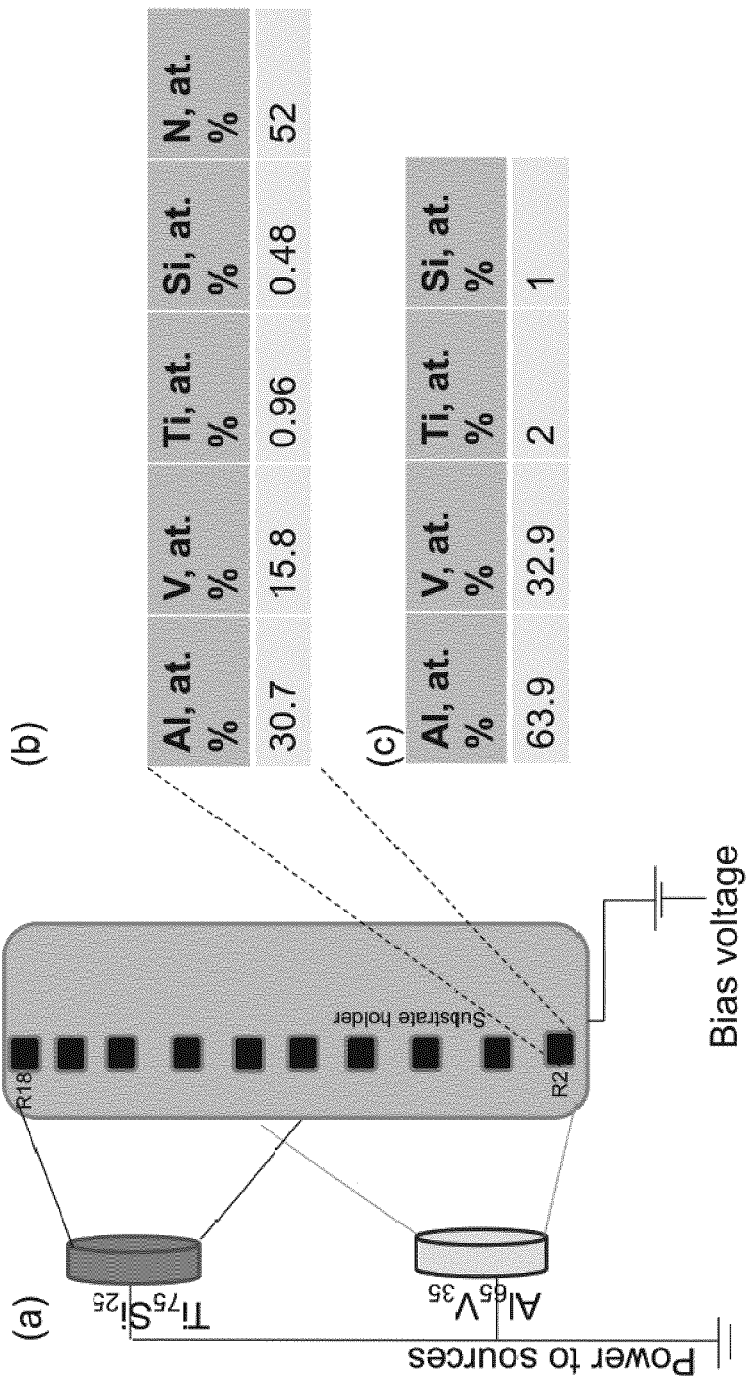
Figure 3:
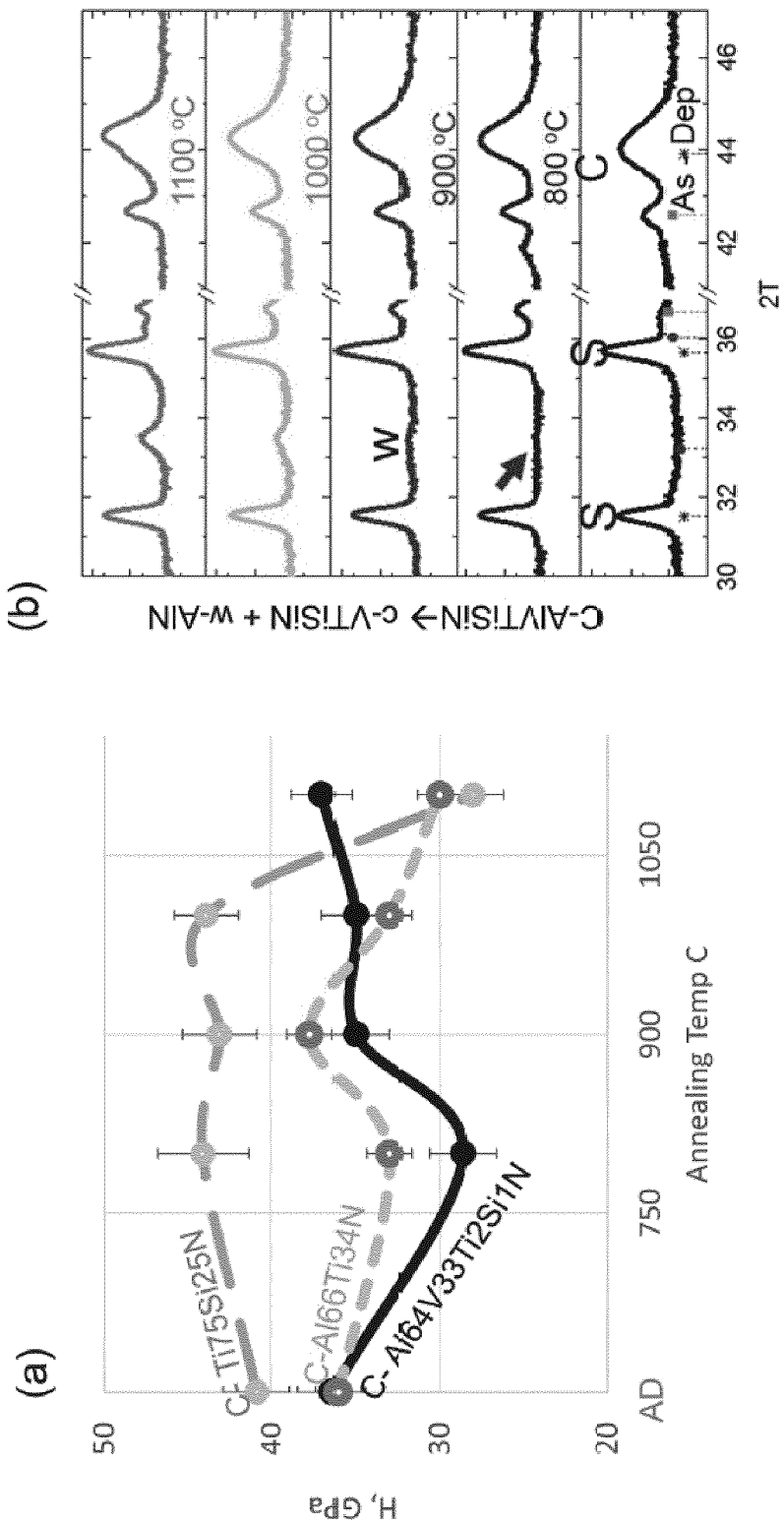

FIG. 1 shows Hardness evolution as a function of annealing temperatures for TiN, and different TM-Al—N, FIG. 2 shows the combinatorial deposition chamber used to synthesize the inventive coating (a), the composition of the inventive coating (b), and the metallic sub-lattice composition of the inventive coating (c), FIG. 3 shows Hardness evolution as a function of annealing temperatures for the inventive c-AlVTiSiN (a), and an X-ray diffractogram of c-AlVTiSiN as a function of annealing temperatures (b).

FIG. 1 shows Hardness evolution as a function of annealing temperatures for TiN, and different TM-Al—N. As shown by FIG. 1 most of the TM-Al—N such as Ti—Al—N, and Cr—Al—N, and Nb—Al—N display a hardness drop above the annealing temperature above 900° C. as shown in FIG. 1. Incontrast, the inventive micro-alloyed AlVN shows a hardness enhancement as a function of annealing temperature above 900° C. as will be shown in FIG. 3) later. This hardness behaviour was re-producible.

The proposed alloy might have also an enhanced fracture toughness, caused by a higher H/E ratio especially at annealing temperatures above 900° C. and the inventive composition could as well be interesting for high temperature struc applications.

FIG. 2 shows the combinatorial deposition chamber used to synthesize the inventive coating (a), the composition of the inventive coating (b), and the metallic sub-lattice composition of the inventive coating (c). According to a first embodiment, the inventive alloy is synthesized in a combinatorial approach with targets of different chemistry consisting of $Al_{65}V_{35}$, and $Ti_{75}Si_{25}$ as shown in the FIG. 2) on WC-Co substrate. Deposition details are presented below.

The coating from Pos.2 in FIG. 2 has shown the claimed anomalous hardness behavior. The composition of the coating is shown in FIG. 2b and FIG. 2c.

The inventive coatings from Pos.2 as well as standard c-$Al_{66}Tl_{34}N$ and c-$Ti_{75}Si_{25}N$ coatings are subjected to vacuum annealing experiments which are performed in an electrically heated oven with a back ground pressure of $10^{-5}$ Pa at temperatures of 800° C., 900° C., 1000° C., and 1100° C. with a soaking time of 60 minutes.

The hardness of the films was measured using nanoindentation, and the structural evolution was mapped using XRD as a function of different annealing temperatures.

FIG. 3 (a) shows hardness evolution as a function of annealing temperatures for the inventive c-$Al_{64}V_{33}Ti_2Si_1N$ alloy as well as for c-$Al_{66}Ti_{34}N$ and for c-$Ti_{75}Si_{25}N$.

Note that for the standard c-$Al_{66}Ti_{34}N$, and c-$Ti_{75}Si_{25}N$ coatings display a hardness drop at an annealing temperature above 1000° C. In contrast, for the inventive c-$Al_{64}V_{33}Ti_2Si_1N$ coatings the hardness increases as a function of annealing temperature, which is an anomalous and not known behavior.

FIG. 3 (b) shows the structural evolution of the inventive c-$Al_{64}V_{33}Ti_2Si_1N$ coating according to the present embodiment as a function of vacuum annealing. XRD shows evolution of wurtzite AlN phase above the annealing temperature of 900° C. Indicating that the alloy undergoes the following reaction

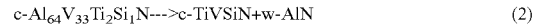

$$c\text{-}Al_{64}V_{33}Ti_2Si_1N \text{---} > c\text{-}TiVSiN+w\text{-}AlN \qquad (2)$$

For the known TM-Al—N alloys, precipitation of w-AlN phase causes lower hardness. Surprisingly however, for the inventive coating the hardness is increasing inspite of precipitation of w-AlN.

Coatings were grown in an industrial scale on an Oerlikon Innova machine using cathodic arc in a nitrogen atmosphere with a pressure of 5 Pa, a substrate temperature of 400° C., and a bias voltage of 70 V. During the arc discharge a magnetic field of Mag 14 and an arc current of 200 A resulting a burning voltage of 27 V.

Though in the example the inventive coating was shown to grow by combinatorial arc depositions, the coating with same compositions could be grown by using the targets with the inventive composition in Arc, Sputtering and other related processes as thin film and bulk form.

The invention claimed is:

1. A high-temperature stable ceramic coating structure comprising a microalloy comprising the elements Al, V, N, Ti and Si, producible by a gas phase deposition process, wherein the microalloy comprises wurtzite AlN.

2. The coating structure according to claim 1, wherein the coating structure is formed in the form of a metastable coating structure, which is in multiphase form at least above a temperature of 900° C.

3. The coating structure according to claim 1, wherein at least the coating structure is stable above a temperature of 900° C. for longer exposure times of more than 50 hours or wherein the coating structure has a layer thickness of less than 10 μm.

4. The coating structure according to claim 1, wherein at least the coating structure is in the form of a thin film or in bulk form or wherein the coating structure is formed as a multilayer structure.

5. The coating structure according to claim 1, wherein the coating structure also comprises at least oxides or carbides in addition to nitrides.

6. The coating structure according to claim 1, wherein the microalloy further comprises cubic TiVSiN.

7. A gas phase deposition process for producing a high temperature stable ceramic coating structure according to claim 1, comprising the steps:
- evaporating a first target material comprising the elements Al and V; p1 evaporating a second target material comprising the elements Ti and Si; and
- gas phase depositing the first evaporated target material and the second evaporated target material on a suitable substrate to form to form a coating structure comprising a microalloy comprising the elements Al, V, N, Ti, and Si; and
- annealing the microalloy above 900° C. to thereby generating wurtzite AlN within the microalloy and produce the high temperature ceramic coating structure, wherein the annealing increases the hardness of the microalloy, increases the toughness of the microalloy, or both.

8. The gas phase deposition process according claim 7, wherein a Co-containing substrate is used.

9. The gas phase deposition process according to claim 7, wherein the substrate temperature is between 200° C. and 500° C.

10. The gas phase deposition process according to claim 7 using a reactive coating gas.

11. The gas phase deposition process according to claim 7, wherein a negative bias voltage is applied to the substrate during the coating process, wherein the bias voltage is less than 120 V.

12. The gas phase deposition process according to claim 7, wherein the coating process is formed in the form of a PVD coating process.

13. The gas phase deposition process according to claim 7, wherein a plurality of layers of a high-temperature stable ceramic coating structure including a microalloy comprising the elements Al, V and N producible by a gas phase deposition process are deposited on top of each other to form a multilayer layer structure.

14. The gas phase deposition process according to claim 7, wherein the suitable substrate is a cutting and forming tool.

15. The gas phase deposition process according claim 7, wherein the microalloy further comprises cubic TiVSiN.

* * * * *